United States Patent [19]

Yang

[11] Patent Number: 5,893,747

[45] Date of Patent: Apr. 13, 1999

[54] METHOD OF MANUFACTURING A POLYSILICON FILM OF A SEMICONDUCTOR DEVICE

[75] Inventor: Hong Seon Yang, Kyungki-Do, Rep. of Korea

[73] Assignee: Hyundai Electronics Industries Co., Ltd., Kyungki-Do, Rep. of Korea

[21] Appl. No.: 08/726,941

[22] Filed: Oct. 7, 1996

[30] Foreign Application Priority Data

Oct. 7, 1995 [KR] Rep. of Korea ............. 95-34402

[51] Int. Cl.$^6$ ................................. H01L 21/326
[52] U.S. Cl. ............ 438/592; 438/482; 438/592; 438/657; 438/660
[58] Field of Search ............... 438/592, 657, 438/660, 485, 482

[56] References Cited

U.S. PATENT DOCUMENTS 5,024,972  6/1991  DePinto et al. ............. 438/384
5,147,820  9/1992  Chittipeddi et al. .......... 438/592
5,652,156  7/1997  Liao et al. ................. 148/DIG. 122
5,712,181  1/1998  Byun et al. ................ 438/592

FOREIGN PATENT DOCUMENTS 5-47661  2/1993  Japan ..................... H01L 21/20

*Primary Examiner*—John F. Niebling
*Assistant Examiner*—Ha Tran Nguyen
*Attorney, Agent, or Firm*—Scott C. Harris, Esq.

[57] ABSTRACT

The present invention relates to a method of manufacturing a polysilicon film having a grain size of 0.5 μm or more by forming a nucleus site of low density at low temperature of about 450° C. with $Si_2H_6$ gas, by growing an amorphous silicon film to some degree with the nucleus site, forming an amorphous silicon film of a device to a desired thickness by carrying out a main deposition process at the temperature of 500 through 600° C. with $SiH_4$ or $SiH_4$ containing a small amount of impurity, and carrying out a heat treatment process for a long period at the temperature range of 600 through 700° C. with $N_2$ gas.

24 Claims, 2 Drawing Sheets

METHOD OF MANUFACTURING A POLYSILICON FILM OF A SEMICONDUCTOR DEVICE

BACKGROUND OF INVENTION

1. Field of the Invention

The present invention relates to a method of manufacturing a polysilicon film of a semiconductor device, and more particularly, to a method of manufacturing a polysilicon film used as a channel region of a thin film transistor.

2. Information Disclosure Statement

In general, the thin film transistor has the characteristics of high stability in data holding, high speed of operation and low consumption of current. The thin film transistor having such characteristics has been applied to highly integrated devices, such as a SRAM device and a LCD device. However, the thin film transistor has a disadvantage in that it has relatively low electrical performance since the polysilicon film is used as a channel region contrary to a general transistor which utilizes a mono crystal silicon film. To solve such disadvantage, a polysilicon film can be manufactured which has similar structure to the mono crystal silicon film. Therefore, research is being performed to increase the gain size of the polysilicon film to the maximum size.

In a method of manufacturing a polysilicon film according to a first embodiment of the prior art for forming a large grain size, an amorphous silicon film is formed in a temperature range of 450 through 550° C. The amorphous silicon film is heat treated for a long period in a temperature range of 600 through 700° C., whereby a solid phase growth (SPG) takes place and a polysilicon film of large grain size is manufactured.

However, since the polysilicon film manufactured according to the first embodiment has no uniformity in the size of the grains, electrical performance between dies or between cells in one wafer greatly varies. Due to the above described fact, the reliability and the mass productivity of the device is degraded. The polysilicon film manufactured by this method has a limitation in that the film can not obtain a grain diameter larger than 0.2 through 0.3 μm.

In a method of manufacturing a polysilicon film according to a second embodiment of the prior art for forming a large grain size, a nucleus site is made by an ion implantation process in a surface portion of a substrate on which the polysilicon film is to be formed, the amorphous silicon film is formed by growing the amorphous silicon with the nucleus as a center, and thereafter the amorphous silicon film is heat treated, whereby a polysilicon film of large grain size is manufactured.

However, in this method, there are some difficulties in the depth control of ion implantation during the ion implantation process and in the density adjustment of the nucleus site. Furthermore, there is the possibility that the nucleus site can be lost during the cleaning treatment carried out after the ion implantation process. Due to the unstable process factors as described above, the reliability and the mass productivity of the device is degraded.

SUMMARY OF THE INVENTION

Therefore, the object of the present invention is to provide a method of manufacturing a polysilicon film having uniform and large grain size.

The method of manufacturing a polysilicon film of the present invention to achieve the above described object is characterized in that it comprises the steps of loading a wafer into a deposition furnace; carrying out a first temperature raising process; forming a first undoped amorphous silicon film by carrying out a pre-treatment process of flowing a first source gas into said deposition furnace, whereby a plurality of nucleus sites are formed on the surface of said wafer in the early stage of said pre-treatment process and an undoped amorphous silicon is grown with said nucleus site as the pre-treatment process time passes by; carrying out a second temperature raising process after stopping the supply of said first source gas; forming a second undoped amorphous silicon film by carrying out a main deposition process of flowing a second source gas into said deposition furnace, whereby an undoped amorphous silicon is grown in continuation of said first undoped amorphous silicon film; unloading from said deposition furnace said wafer on which said second undoped amorphous silicon film is formed, after lowering the temperature; and forming an undoped polysilicon film by solid phase growing said second undoped amorphous silicon film with a heat treatment process.

Another method of manufacturing is characterized in that it comprises the steps of loading a wafer into a deposition furnace; carrying out a first temperature raising process; forming an undoped amorphous silicon film by carrying out a pre-treatment process of flowing a first source gas into said deposition furnace, whereby a plurality of nucleus sites are formed on the surface of said wafer in the early stage of said pre-treatment process and an undoped amorphous silicon is grown with said nucleus site by continuously carrying out the pre-treatment process; carrying out a second temperature raising process after stopping the supply of said first source gas; forming a doped amorphous silicon film by carrying out a main deposition process of flowing a second source gas into said deposition furnace, whereby a doped amorphous silicon is grown in continuation of said first undoped amorphous silicon film; unloading from said deposition furnace said wafer on which said doped amorphous silicon film is formed, after lowering the temperature; and forming an undoped polysilicon film by solid phase growing said doped amorphous silicon film with a heat treatment process, and at the same time, forming a doped amorphous silicon film by diffusing an impurity into said undoped amorphous silicon film.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts in the several views of the drawings.

DETAILED DESCRIPTION OF THE INVENTION

A detailed description of the invention is given below with reference to the accompanying drawings.

Figure 1A:
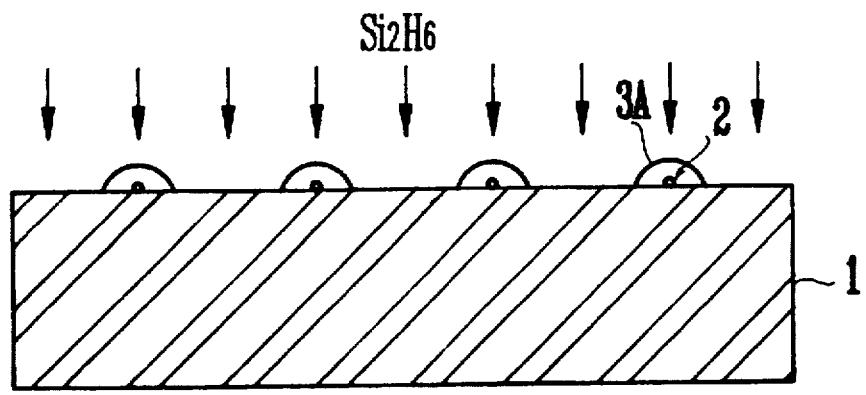
FIGS. 1A through 1C are sectional views of a device to illustrate the method of manufacturing a polysilicon film of a semiconductor device according to a first embodiment of the present invention.
Figure 1B:
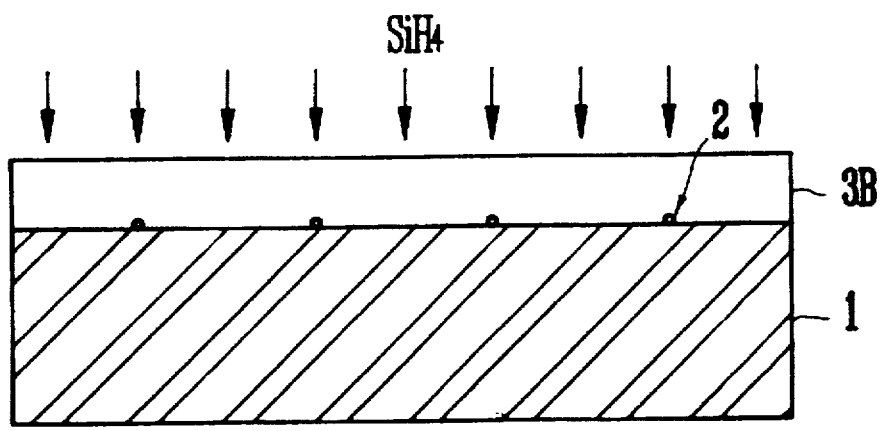
Figure 1C:
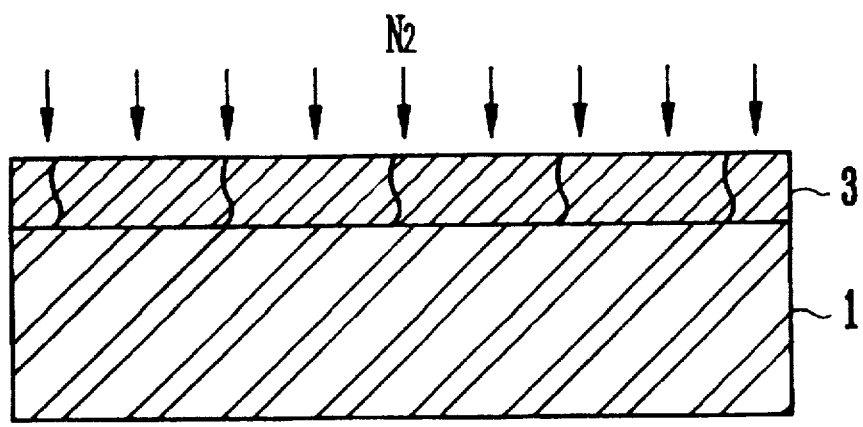

FIGS. 1A through 1C are sectional views of a device to illustrate the method of manufacturing a polysilicon film of a semiconductor device according to a first embodiment of the present invention.

Referring to FIG. 1A, a wafer 1 which is treated with sulphuric acid and fluoric acid series solution is loaded into a deposition furnace which is in the condition temperature of 400° C. or below. The inside of the deposition furnace is vacuumized and, at the same time, a first temperature raising process is performed so that the temperature of the inside of the deposition furnace is in a range of 400 through 500° C. A pre-treatment process of flowing a $Si_2H_6$ gas, which is a first source gas, into the deposition furnace. The $Si_2H_6$ gas is heat decomposed by the inside temperature of the deposition furnace, and a plurality of nucleus sites 2 are formed on the surface of the wafer 1 by silicon ions among the ions which are heat decomposed. The nucleus sites 2 are formed in the early stage of the pre-treatment process, and undoped amorphous silicon is grown with the nucleus site 2 as the process time passes by, whereby a first undoped amorphous silicon film 3A is formed.

In the above description, the density of plurality of nucleus sites 2 formed on the surface of the wafer 1 is greatly affected by the temperature of the wafer 1. The higher the temperature of the wafer 1, the higher the density of the nucleus sites 2, and the lower the temperature, the lower the density of the nucleus sites 2. In case where the inside temperature of the deposition furnace is lowered as in the embodiment of the present invention, since the temperature of the wafer 1 itself also becomes the lower temperature condition of 400 through 500° C., the density of the number of nucleus sites 2 formed on the surface of the wafer 1 becomes very low.

In the above description, the first undoped amorphous silicon film 3A which is grown with each nucleus site 2 as a center is changed from a discontinuous condition to a continuous condition as the pre-treatment process time passes by. As shown in FIG. 1A, to form the first undoped amorphous silicon film 3A in discontinuous condition, it is preferable to grow the first undoped amorphous silicon film 3A to a thickness of 10 through 100 Å. On the other hand, the first undoped amorphous silicon film 3A shall be grown to the thickness of 100 through 200 Å to be in the continuous condition.

Referring to FIG. 1B, the supply of the first source gas is stopped while maintaining the deposition furnace in the vacuum condition, and a second temperature raising process is carried out so that the inside temperature of the deposition furnace is in the range of 500 through 600° C. When the second temperature raising process is completed, a main deposition process is carried out in which a $SiH_4$ gas, which is a second source gas, is flowed into the deposition furnace so that the undoped amorphous silicon is grown in continuation on top of the first undoped amorphous silicon film 3A, whereby a second undoped amorphous silicon film 3B is formed.

Referring to FIG. 1C, the second source gas supply is stopped, the temperature is lowered to 400° C. or below, and the wafer 1 on which the second undoped amorphous silicon film 3B is formed is unloaded from the deposition furnace. By carrying out the heat treatment process for 1 hour through 20 hours at the temperature range of 600 through 700° C. under $N_2$ gas atmosphere at atmospheric pressure or vacuum condition, the second undoped amorphous silicon film 3B is formed through solid phase growth with the nucleus site 2 as a center, whereby the undoped polysilicon film 3 is formed. Therefore, the grain size of the undoped polysilicon film 3 is decided according to the density of the number of nucleus sites 2, and if the nucleus sites 2 are formed at a low temperature below 450° C., a grain size of 0.5 μm or more can be obtained.

Figure 2A:
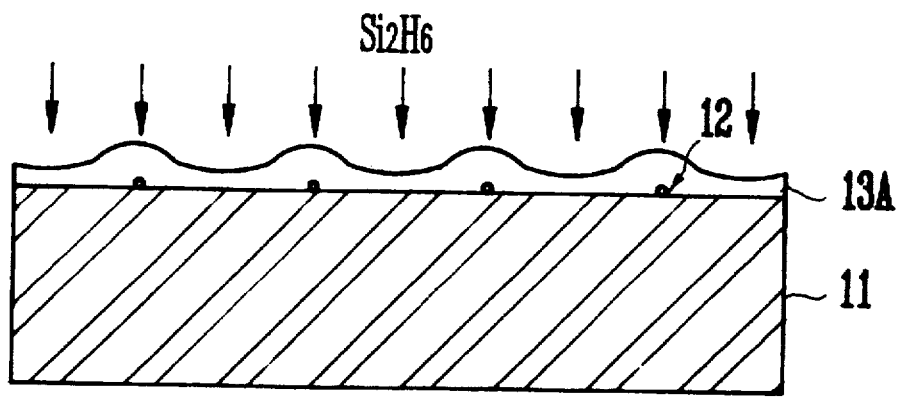
FIGS. 2A through 2C are sectional views of a device to illustrate the method of manufacturing a polysilicon film of a semiconductor device according to a second embodiment of the present invention.
Figure 2B:
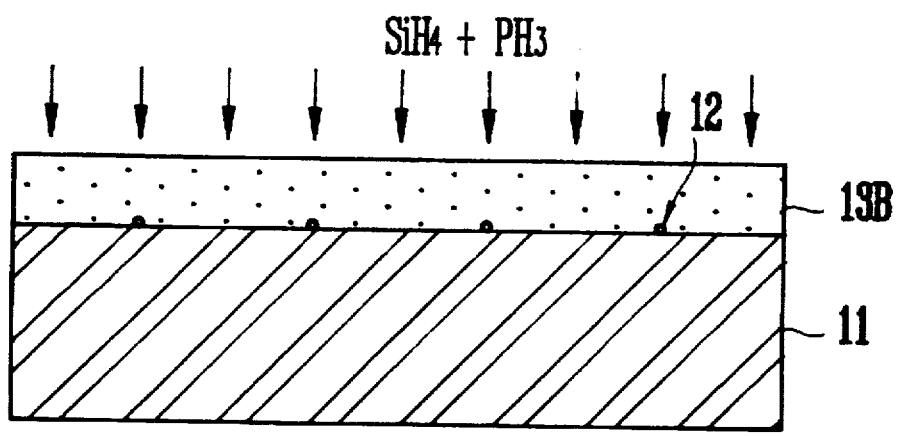
Figure 2C:
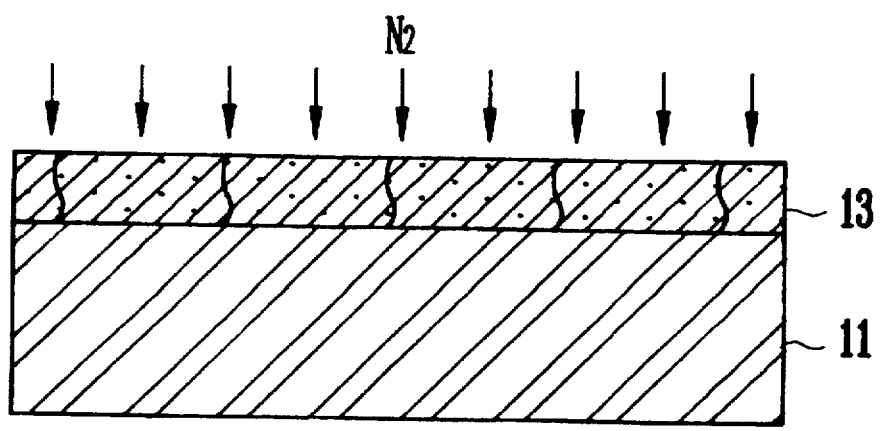

FIG. 2A through 2C are sectional views to illustrate the method of manufacturing a polysilicon film of a semiconductor device of a second embodiment of the present invention.

Referring to FIG. 2A, a wafer 11 which is treated with sulphuric acid and fluoric acid series solution is loaded into a deposition furnace at a temperature of 400° C. or below. The inside of the deposition furnace is vacuumized and, at the same time, a first temperature raising process is performed so that the temperature of the inside of the deposition furnace is in a range of 400 through 500° C. A pre-treatment process of flowing a $Si_2H_6$ gas, which is a first source gas, into the deposition furnace is initiated. The $Si_2H_6$ gas is heat decomposed by the inside temperature of the deposition furnace, and a plurality of nucleus sites 12 are formed on the surface of the wafer 11 by silicon ions released during heat decomposition. The nucleus sites 12 are formed in the early stage of the pre-treatment process, and undoped amorphous silicon is grown with the nucleus site 12 formed on the wafer 11 by extending the pre-treatment process time so that an undoped amorphous silicon film 13A is formed in a continuous condition.

To form the undoped amorphous silicon film 13A in a continuous condition, it is preferable to form the film 13A to a thickness of 100 through 200 Å.

Referring to FIG. 2B, the supply of the first source gas is stopped while maintaining the deposition furnace in the vacuum condition, and a second temperature raising process is carried out so that the inside temperature of the deposition furnace is in the range of 500 through 600° C. When the second temperature raising process is completed, a main deposition process is carried out in which the $SiH_4$ gas containing a small amount of impurity, for example, the $SiH_4$ gas containing $PH_3$ gas of 1 through 4%, which is a second source gas, is flowed into the deposition furnace so that a doped amorphous silicon is grown in continuation of the undoped amorphous silicon film 13A, whereby a doped amorphous silicon film 13B is formed.

Referring to FIG. 2C, the second source gas supply is stopped, the temperature is lowered to 400° C. or below, and the wafer 11 on which doped amorphous silicon film 13B is formed is unloaded from the deposition furnace. By carrying out the heat treatment process for 1 hour through 20 hours at the temperature range of 600 through 700° C. under $N_2$ gas atmosphere at atmospheric pressure or vacuum condition, the doped amorphous silicon film 13B is formed by solid phase growth with the nucleus site 12 as a center, whereby a doped polysilicon film 13 is formed. Therefore, the grain size of the doped polysilicon film 13 is dependent on the density of the nucleus site 12, and if the nucleus site 12 is formed at a low temperature of 450° C. or below, a grain size of 0.5 μm or more can be obtained with uniformity.

As described above, the polysilicon film formed according to the present invention can obtain the gain size of 0.5 μm or more, and since the grain size is uniform, if the polysilicon film is applied to a thin film transistor, the electrical characteristics of the thin film transistor can be improved, so that a high degree of integration of the device can be implemented.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of manufacturing a polysilicon film of a semiconductor device comprising the steps of:

loading a wafer into a deposition furnace;

carrying out a first temperature raising process;

forming a first undoped amorphous silicon film by carrying out a pre-treatment process of flowing a first source gas into said deposition furnace, whereby a plurality of nucleus sites are formed on the surface of said wafer in the early stage of said pre-treatment process and an undoped amorphous silicon is grown with said nucleus site as the pre-treatment process time passes by;

carrying out a second temperature raising process after stopping the supply of said first source gas;

forming a second undoped amorphous silicon film by carrying out a main deposition process of flowing a second source gas into said deposition furnace, whereby an undoped amorphous silicon is grown in continuation of said first undoped amorphous silicon film;

unloading from said deposition furnace said wafer on which said second undoped amorphous silicon film is formed, after lowering the temperature; and forming an undoped polysilicon film by solid phase growing said second undoped amorphous silicon film with a heat treatment process.

2. The method of claim 1, wherein the inside temperature of said deposition furnace is maintained at about 400° C. at the time of loading and unloading said wafer.

3. The method of claim 1, wherein said first temperature raising process is carried out so that the inside temperature of said deposition furnace is in a temperature range of 400 through 500° C., and at the same time the inside of said deposition furnace is vacuumized.

4. The method of claim 1, wherein said first source gas is $Si_2H_6$ gas.

5. The method of claim 1, wherein said nucleus site is formed by heat decomposition of said $Si_2H_6$ gas.

6. The method of claim 1, wherein said first undoped amorphous silicon film is formed in a discontinuous condition.

7. The method of claim 6, wherein said first undoped amorphous silicon film is formed to a thickness of 10 through 100 Å to form said first undoped amorphous silicon film in a discontinuous condition.

8. The method of claim 1, wherein said first undoped amorphous silicon film is formed in a continuous condition.

9. The method of claim 8, wherein said first undoped amorphous silicon film is formed to a thickness of 100 through 200 Å to form said first undoped amorphous silicon film in a continuous condition.

10. The method of claim 1, wherein said second temperature raising process is carried out so that the inside temperature of said deposition furnace is in a temperature range of 500 through 600° C.

11. The method of claim 1, wherein said second source gas is $SiH_4$ gas.

12. The method of claim 1, wherein said heat treatment process is carried out for 1 hour through 20 hours at the temperature range of 600 through 700° C. under $N_2$ gas atmosphere at atmospheric pressure.

13. The method of claim 1, wherein said heat treatment process is carried out for 1 hour through 20 hours at the temperature range of 600 through 700° C. under vacuum condition.

14. A method of manufacturing a polysilicon film of a semiconductor device comprising the steps of:

loading a wafer into a deposition furnace;

carrying out a first temperature raising process;

forming a first undoped amorphous silicon film by carrying out a pre-treatment process of flowing a first source gas into said deposition furnace, whereby a plurality of nucleus sites are formed on the surface of said wafer in the early stage of said pre-treatment process and an undoped amorphous silicon is grown with said nucleus site as the pre-treatment process time passes by;

carrying out a second temperature raising process after stopping the supply of said first source gas;

forming a doped amorphous silicon film by carrying out a main deposition process of flowing a second source gas into said deposition furnace, whereby a doped amorphous silicon is grown in continuation of said undoped amorphous silicon film;

unloading from said deposition furnace said wafer on which said doped amorphous silicon film is formed, after lowering the temperature; and forming a doped polysilicon film by solid phase growing said doped amorphous silicon film with a heat treatment process; and at the same time, forming a doped amorphous silicon film by diffusing an impurity into said undoped amorphous silicon film.

15. The method of claim 14, wherein the inside temperature of said deposition furnace is maintained at 400° C. at the time of loading and unloading said wafer.

16. The method of claim 14, wherein said first temperature raising process is carried out so that the inside temperature of said deposition furnace is in a temperature range of 400 through 500° C., and at the same time the inside of said deposition furnace is vacuumized.

17. The method of claim 14, wherein said first source gas is $Si_2H_6$ gas.

18. The method of claim 14, wherein said nucleus site is formed by heat decomposition of said $Si_2H_6$ gas.

19. The method of claim 14, wherein said undoped amorphous silicon film is formed to a thickness of 100 through 200 Å.

20. The method of claim 14, wherein said second temperature raising process is carried out so that the inside temperature of said deposition furnace is in a temperature range of 500 through 600° C.

21. The method of claim 14, wherein said second source gas is $SiH_4$ gas containing an impurity.

22. The method of claim 14, wherein said second source gas is $SiH_4$ gas containing 1 through 4% $PH_3$ gas.

23. The method of claim 14, wherein said heat treatment process is carried out for 1 hour through 20 hours at the temperature range of 600 through 700° C. under $N_2$ gas atmosphere at atmospheric pressure.

24. The method of claim 14, wherein said heat treatment process is carried out for 1 hour through 20 hours at the temperature range of 600 through 700° C. under vacuum condition.

* * * * *